United States Patent

Huggins

[11] Patent Number: 6,153,268
[45] Date of Patent: Nov. 28, 2000

[54] METHOD FOR PRODUCING ORIENTED PIEZOELECTRIC FILMS

[75] Inventor: Harold Alexis Huggins, Watchung, N.J.

[73] Assignee: Lucent Technologies Inc., Murray Hill, N.J.

[21] Appl. No.: 09/363,758

[22] Filed: Jul. 29, 1999

[51] Int. Cl.[7] ........................................................ B05D 1/04
[52] U.S. Cl. ............................ 427/475; 427/100; 427/483
[58] Field of Search ..................................... 427/100, 475, 427/483, 529, 530, 531, 562, 564, 576, 569; 204/192.18; 117/101, 103

[56] References Cited

U.S. PATENT DOCUMENTS 3,988,232   10/1976   Wasa et al. .
4,309,266   1/1982    Nakamura et al. .
5,344,676   9/1994    Kim et al. .
5,948,483   9/1999    Kim et al. .

OTHER PUBLICATIONS

S.M. Rossnagel et al, "Metal Ion Deposition from Ionized Magnetron Sputtering Discharge", J. Vac. Sci. Technol, vol. 12, No. 1, Jan./Feb. 1994, pp. 449–453.

S.M. Rossnagel, "Ionized Magnetron Sputtering for Lining and Filling Trenches and Vias", Semiconductor Int'l, Feb. 1996, pp. 99–101.

*Primary Examiner*—Fred J. Parker
*Attorney, Agent, or Firm*—Lucian C. Canepa

[57] ABSTRACT

Highly oriented thin films exhibiting good piezoelectric effects are formed in a reaction chamber. This is done by bombarding a target comprising a piezoelectric material. Dislodged particles from the target are ionized and then electrostatically attracted to the surface of a substrate where they are neutralized and deposited in an ordered way.

7 Claims, 1 Drawing Sheet

METHOD FOR PRODUCING ORIENTED PIEZOELECTRIC FILMS

TECHNICAL FIELD

This invention relates to thin films and, more particularly, to a method for forming thin piezoelectric films.

BACKGROUND OF THE INVENTION

In a variety of applications of practical importance, filters comprising thin films of a piezoelectric material constitute an attractive alternative to other conventional miniature filters. This is particularly true, for example, in handset applications for telecommunications where reducing both the size and cost of filters is critical.

Compared to other filter techniques, thin-film piezoelectric filters have the potential for superior performance, lower cost and substantial reduction in size. Until now, however, it has been exceedingly difficult to produce the requisite thin films of piezoelectric material in a reproducible low-cost manufacturing process.

To make a high-quality thin-film piezoelectric filter, it is necessary that a film of piezoelectric material be deposited in a prespecified oriented manner. Heretofore, efforts to produce such films have relied on various techniques such as collimation, long source-to-substrate distances (long-throw technique) and controlling the nature and condition of the substrate on which the film is formed. But even such measures have not been successful in consistently producing films having the required piezoelectric characteristics. In particular, collimation and long-throw techniques substantially reduce deposition rates, thereby making the deposition times significantly longer than desired.

Accordingly, efforts have continued by workers skilled in the art directed at trying to devise improved ways of producing oriented thin films of piezoelectric material for filter applications. It was recognized that such efforts, if successful, would improve the quality and lower the cost of thin-film piezoelectric filters.

SUMMARY OF THE INVENTION

In accordance with the principles of the present invention, particles of a piezoelectric material are ionized in a reaction chamber and then deposited on an electrically biased substrate in the chamber. In that way, a thin layer exhibiting good piezoelectric characteristics is formed.

BRIEF DESCRIPTION OF THE DRAWING

A complete understanding of the present invention and of the above and other features and advantages thereof may be gained from a consideration of the following detailed description presented hereinbelow in connection with the accompanying drawing, not drawn to scale, in which.

DETAILED DESCRIPTION

Figure 1:
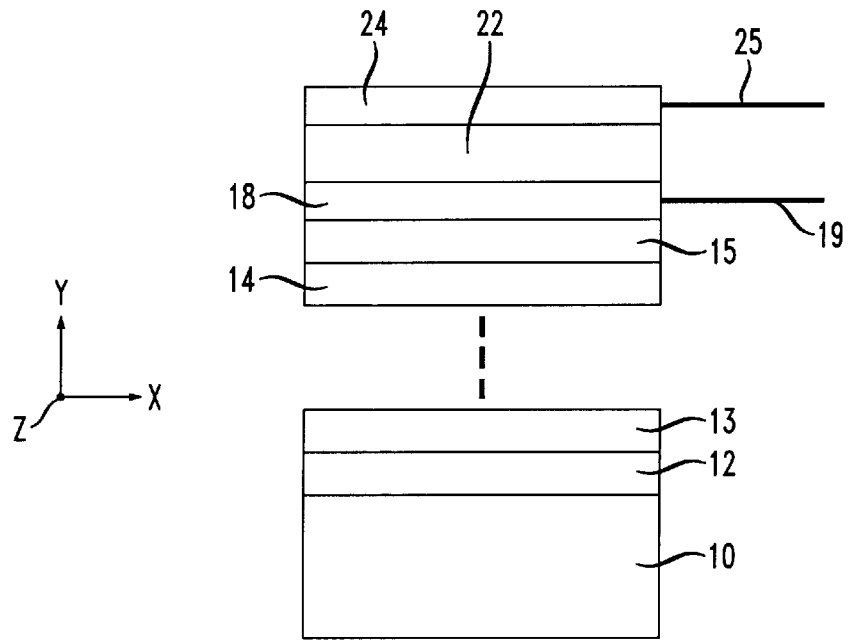
FIG. 1 is a side-view depiction of a specific illustrative thin-film filter structure as heretofore proposed.

Illustratively, the conventional thin-film piezoelectric filter depicted in FIG. 1 is formed on a substrate 10 made of silicon or other suitable material such as quartz or sapphire. The substrate 10 may comprise a standard twenty-centimeter-diameter wafer having a Y-direction thickness of about 600 micrometers ($\mu$m). In that case, multiple filter devices are advantageously formed on the substrate 10 at the same time in a standard batch-fabrication process. Herein, only one such device is explicitly shown in FIG. 1 and described in detail below. By way of example, the X and Z dimensions of the single depicted filter are each approximately 200-to-500 $\mu$Mm. The actual dimensions will depend on the particular design of the filter, as is well known.

In a conventional manner, an acoustic Bragg reflector comprising alternating layers of high- and low-acoustic-impedance material is typically deposited on the top surface of the substrate 10 of FIG. 1. Thus, for example, four pairs of such layers, each pair comprising a layer of silicon dioxide ($SiO_2$) and a layer of tantalum oxide ($Ta_2O_5$), are so formed. As is well known, the thickness of each such layer is selected to be equal to a quarter wavelength of the center frequency of the bandwidth of the indicated filter. Layers 12 ($Ta_2O_5$), 13 ($SiO_2$) and 14 ($Ta_2O_5$), 15($SiO_2$) in FIG. 1 constitute two pairs of the layers of the noted acoustic reflector.

Next, a layer 18 constituting a bottom electrode of the herein-considered filter is formed overlying the afore-described multi-layer acoustic reflector. The layer 18 is made of a material that exhibits low electrical resistance and low acoustic loss. Illustratively, the layer 18 comprises aluminum (Al) or molybdenum (Mo) having, for example, a Y-direction thickness of about 1000 Angstrom units. An electrical lead 19 is shown connected to the bottom electrode layer 18.

Subsequently, in a conventional illustrative filter of the type shown in FIG. 1, a layer 22 of a suitable piezoelectric material is formed on the electrode 18. Thus, for example, a layer 22 of aluminum nitride (AlN) or zinc oxide (ZnO) having a Y-direction thickness of half the wavelength of the desired center frequency is deposited overlying the bottom electrode 18. Lastly, a second or top electrode 24, also made, for example, of a 1000-Angstrom unit-thick layer of Al or Mo, is formed on the top surface of the piezoelectric layer 22. In turn, an electrical lead 25 is connected to the top electrode layer 24.

It is well known that the electromechanical coupling constant of the piezoelectric layer 22 is a function of the crystalline orientation of the layer 22. Thus, for example, for a layer 22 made of low-stress stoichiometric AlN, the piezoelectric properties thereof are optimized if the layer is deposited such that its (002) crystalline axis is parallel to the depicted Y axis.

Heretofore, various techniques have been employed to impose a desired orientation on the piezoelectric material constituting the layer 22 of FIG. 1. One known technique involves depositing a thin layer (not shown) of collimated titanium nitride (TiN) on the top-most layer 15 of $SiO_2$ shown in FIG. 1. Such a structurally ordered TiN layer tends to impose a corresponding orientation on an overlying electrode layer 18 made of Al. In turn, it has been found that such an oriented Al layer causes a subsequently formed piezoelectric layer made of AlN to be deposited with an (002) crystalline orientation. But, at best, piezoelectric films formed in this particular way exhibit an X-ray diffraction rocking curve of greater than 1.2 degrees.

In accordance with the principles of the present invention, a film of piezoelectric material having a predetermined crystalline orientation is deposited in a simple, robust and reliable manner that is consistently reproducible. Such a film exhibits good piezoelectric characteristics suitable for, for example, a variety of thin-film filter applications.

Figure 2:
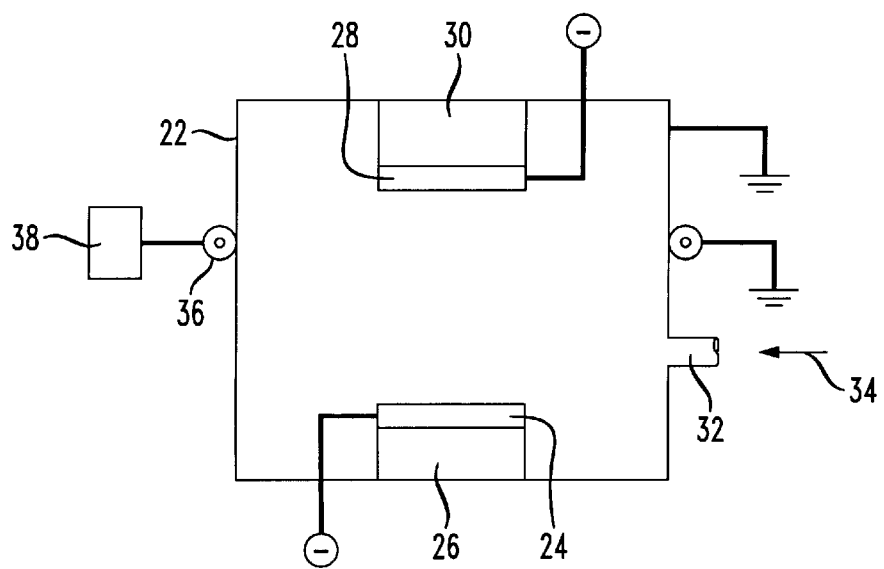
FIG. 2 shows in simplified schematic form an illustrative way in which to carry out the inventive method to form a thin-film piezoelectric layer for inclusion in a filter of the type represented in FIG. 1.

FIG. 2 shows in simplified schematic form a specific illustrative apparatus of the type employed for depositing piezoelectric films in accordance with the invention. The apparatus comprises a reaction chamber 22 that is electrically connected to a point of reference potential such as ground. A substrate 24 whose top surface is to be coated with a thin piezoelectric film is shown mounted on a base member 26 within the chamber 22. Further, a target 28 comprising a constituent of the material to be deposited on the substrate 24 is shown affixed to a member 30 in the chamber 22.

In accordance with the invention, gases are introduced into the reaction chamber 22 of FIG. 2 via inlet pipe 32, as indicated by arrow 34. For the particular case in which the piezoelectric material to be deposited on the surface of the substrate 24 comprises AlN, the gases introduced into the chamber 22 comprise, for example, nitrogen (a constituent of the piezoelectric material to be deposited) and an inert gas such as argon. In that case, the target 28 is made of aluminum.

In a conventional manner, the gases introduced into the chamber 22 of FIG. 2 are ionized. This is done by establishing a relatively high potential between the target 28 and the grounded chamber 22. As is known, this potential can be a constant direct-current (d-c) voltage. a pulsed d-c voltage or an alternating-current voltage. By way of example, assume that a constant d-c voltage is utilized for this purpose.

Illustratively, assume that the target 28 (made, for example, of aluminum) is maintained at a constant negative d-c potential of about 1000 volts relative to the chamber 22. As a result, for the case in which nitrogen and argon are introduced into the chamber 22, a plasma comprising positively charged nitrogen and argon ions is thereby formed in the chamber. These ions are attracted to the negatively charged target 28. At the target, the nitrogen ions combine with aluminum to form a surface layer of AlN. In turn, the resulting AlN layer is impacted by argon ions. Particles of AlN are thereby dislodged from the target and propelled downward within the chamber 22.

In accordance with the invention, particles of a piezoelectric material (for example, AlN) dislodged from the target 28 of FIG. 2 are ionized by establishing an electric field within the chamber 22. Illustratively, this is done by placing a coil 36 around the chamber 22. In turn, the coil is connected to a radio-frequency (r-f) generator 38 which operates, for example, at a frequency of 13.56 megaHertz and supplies power in the range of 10-to-300 Watts.

In response to such an r-f field, neutral particles of AlN dislodged from the target 28 are transformed in the chamber 22 into positive ions of AlN. In turn, these positive ions are attracted to and deposited on the surface of the substrate 24, which, for example, is connected to a negative d-c potential of about 100 volts. At the substrate surface, the attracted AlN ions are neutralized and form a layer of AlN.

It has been found that a layer of a piezoelectric material such as AlN deposited in the unique manner described above assumes a highly ordered crystalline orientation. In particular, AlN is deposited such that its (002) crystalline axis is highly parallel to the Y axis indicated in FIG. 1. Consequently, the deposited material exhibits good piezoelectric characteristics such as a coupling constant close to the theoretical maximum of 6.5% and an advantageous rocking curve characteristic.

In accordance with the principles of the present invention, other known piezoelectric materials can be deposited in a prespecified oriented manner. In each such case, the piezoelectric material to be deposited is first ionized and then electrostatically attracted to the substrate to be coated.

Thus, for example, a piezoelectric material such as ZnO can be deposited by following the techniques specified above. Illustratively, in that case the target 28 of FIG. 2 is made of zinc, and the gases introduced into the chamber 22 via the inlet pipe 32 comprise oxygen (a constituent of the piezoelectric material to be deposited) and an inert gas such as argon. A layer of ZnO is thereby formed on the surface of the target 28. In turn, particles of this layer are dislodged by argon ions. Subsequently, dislodged particles are ionized by the aforementioned r-f field and deposited on the surface of the negatively charged substrate 24 in a highly oriented way. In particular, the resulting deposited film of ZnO exhibits a strong (002) crystalline orientation and good piezoelectric properties.

In some cases, it is advantageous to direct the ionized piezoelectric material at a substrate that is specially prepared to further enhance the crystalline orientation that inherently results from depositing ionized material. Thus, for example, if the substrate comprises an aluminum electrode overlying a thin collimated layer of titanium nitride, the aluminum electrode layer assumes a highly ordered orientation dictated by the titanium nitride. In that case, the subsequently deposited piezoelectric film assumes an even more highly ordered (002) crystalline orientation.

Finally, it is to be understood that the various above-described arrangements are only illustrative of the application of the principles of the present invention. In accordance with these principles, numerous other arrangements may be devised by those skilled in the art without departing from the spirit and scope of the present invention. Thus, for example, other ways of supplying ions of a piezoelectric material to be deposited on an electrostatically charged substrate are feasible. By way of example, a standard hollow-cathode magnetron gun can be utilized to supply the requisite ions. Further, it is apparent that the invention also includes such techniques as rf sputtering of a ceramic target comprising AlN or ZnO, with subsequent ionization of dislodged particles. Also, although emphasis herein has been directed to depositing AlN and ZnO, it is to be understood that the principles of the present invention are also applicable to forming oriented films of other known piezoelectric materials such as gallium nitride, lithium niobate and lithium tantalate.

What is claimed is:

1. A method for depositing a film of a piezoelectric material, said method comprising the steps of
   ionizing particles of a piezoelectric material that is to be deposited on the surface of a substrate,
   and electrostatically attracting said ionized particles to the surface of said substrate to form a film thereon,
   wherein said steps occur in a reaction chamber into which are introduced an inert gas and a gas that comprises a constituent of said piezoelectric material,
   wherein said introduced gases are ionized and electrostatically attracted to a target that comprises a constituent of said piezoelectric material,
   wherein said constituent gas ions combine with the material of said target to form a piezoelectric material,
   wherein said inert gas ions dislodge particles of said piezoelectric material,
   and wherein said dislodged particles are ionized by an r-f electric field established within said chamber.

2. A method as in claim 1 wherein said target comprises aluminum, said inert gas comprises argon, said constituent gas comprises nitrogen and said piezoelectric material comprises aluminum nitride.

3. A method as in claim 2 wherein dislodged particles of aluminum nitride are ionized by said r-f electric field established within said chamber.

4. A method as in claim 3 wherein the aluminum nitride piezoelectric film formed on the surface of said substrate exhibits an (002) crystalline orientation.

5. A method as in claim 1 wherein said target comprises zinc, said inert gas comprises argon, said constituent gas comprises oxygen and said piezoelectric material comprises zinc oxide.

6. A method as in claim 5 wherein dislodged particles of zinc oxide are ionized by said r-f electric field established within said chamber.

7. A method as in claim 6 wherein the zinc oxide piezoelectric film formed on the surface of said substrate exhibits an (002) crystalline orientation.

* * * * *